United States Patent
Shi

(10) Patent No.: US 10,124,364 B2
(45) Date of Patent: Nov. 13, 2018

(54) DEVICES AND MANUFACTURING METHODS FOR MANUFACTURING ORGANIC LIGHT EMITTING DEVICES (OLEDS)

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 183 days.

(21) Appl. No.: 15/038,869

(22) PCT Filed: Apr. 8, 2016

(86) PCT No.: PCT/CN2016/078798
§ 371 (c)(1),
(2) Date: May 24, 2016

(87) PCT Pub. No.: WO2017/156813
PCT Pub. Date: Sep. 21, 2017

(65) Prior Publication Data
US 2018/0085775 A1    Mar. 29, 2018

(30) Foreign Application Priority Data
Mar. 15, 2016    (CN) .......................... 2016 1 0146392

(51) Int. Cl.
*H01L 51/56*    (2006.01)
*B05C 11/10*    (2006.01)
(Continued)

(52) U.S. Cl.
CPC ........... *B05C 11/10* (2013.01); *H01L 51/0005* (2013.01); *H01L 51/56* (2013.01); *B41J 2/01* (2013.01)

(58) Field of Classification Search
CPC .................................................... H01L 51/0005
See application file for complete search history.

(56) References Cited

U.S. PATENT DOCUMENTS 5,992,968 A * 11/1999 Uetsuki .................. B41J 2/04
                                                               347/37
6,550,886 B2    4/2003 Shimizu
(Continued)

FOREIGN PATENT DOCUMENTS

CN    1612671 A    5/2005
CN    102173200 A    9/2011
(Continued)

*Primary Examiner* — Robert A Vetere
(74) *Attorney, Agent, or Firm* — Andrew C. Cheng

(57) ABSTRACT

The present disclosure relates to a manufacturing device and a manufacturing method of OLEDs. The manufacturing device includes a sprayer and a moving unit. The sprayer is arranged above a substrate, and the sprayer includes at least one nozzle configured to ejected ink on a surface of the substrate. The moving unit is configured to control the sprayer to relatively move with respect to the substrate. During an ejecting process of the ink, an ejecting speed of the ink injected by the nozzle includes a first speed weight along a horizontal direction with respect to the surface of the substrate, and a relative moving speed between the sprayer and the substrate comprises a second speed weight along the horizontal direction. The first speed weight is opposite to the second speed weight. As such, the ink may fall within a designated area so as to overcome the ink-jet printing error.

5 Claims, 2 Drawing Sheets

(51) Int. Cl.
*H01L 51/00* (2006.01)
*B41J 2/01* (2006.01)

(56) References Cited

U.S. PATENT DOCUMENTS

| | | | |
|---|---|---|---|
| 7,368,145 | B2 | 5/2008 | Ito |
| 2001/0026298 | A1* | 10/2001 | Silverbrook ......... B41J 2/14427 |
| | | | 347/20 |
| 2002/0075345 | A1 | 6/2002 | Shimizu |
| 2002/0090495 | A1* | 7/2002 | Bezenek .................. B41J 3/407 |
| | | | 428/32.19 |
| 2004/0189727 | A1 | 9/2004 | Eguchi |
| 2005/0054751 | A1 | 3/2005 | Namba |
| 2005/0100660 | A1 | 5/2005 | Ito |
| 2012/0225250 | A1* | 9/2012 | Kuznetsov .............. C23C 18/08 |
| | | | 428/156 |
| 2014/0161968 | A1 | 6/2014 | Kang |

FOREIGN PATENT DOCUMENTS

| | | |
|---|---|---|
| CN | 103646920 A | 3/2014 |
| CN | 104228339 A1 | 12/2014 |
| TW | 200517267 A | 6/2005 |

\* cited by examiner

DEVICES AND MANUFACTURING METHODS FOR MANUFACTURING ORGANIC LIGHT EMITTING DEVICES (OLEDS)

BACKGROUND OF THE INVENTION

1. Field of the Invention

The present disclosure relates to OLED technology, and more particularly to a device and a manufacturing method for manufacturing OLEDs.

2. Discussion of the Related Art

Displays for displaying a variety of information on the panels is the core technology nowadays, and thus thinner, lighter, and portable displays with high performance have been developed. In order to overcome the shortages of the CRT, such as weight and dimension, the flat displays have drew a great deal of attentions. By adopting a thin organic light-emitting layer between electrodes, the OLED may be a self-light-emitting device. The OLED may be as thin as one paper. The OLED may be divided into small molecular OLEDs and polymer OLEDs. Usually, the organic light-emitting layer of the small molecular OLED is formed to be a thin film by vacuum deposition. The light-emitting layer of the polymer OLEDs is formed to be the thin film by solution coating method, such as spinning or inkjet printing.

When the light-emitting layer is formed by inkjet printing, after the ink is ejected, the ink may include an uniform speed along the moving direction of the sprayer and an acceleration (g) contributing to move downward. Thus, the ink may move horizontally or obliquely. Thus, the ink may fall in advance, such as falling at one location far away from a central point of the pixel area.

SUMMARY

The present disclosure relates to a device and a manufacturing method for manufacturing OLEDs for decreasing inks that may fall on other locations due to horizontal rotation.

In one aspect, a manufacturing method of organic light emitting devices (OLEDs) includes: controlling a sprayer and a substrate to conduct relative movement; when the sprayer moves to a predetermined area of a surface of the substrate, at least one nozzle of the sprayer is configured to eject ink, wherein during an ejecting process of the ink, an ejecting speed of the ink injected by the nozzle includes a first speed weight along a horizontal direction with respect to the surface of the substrate, and a relative moving speed between the sprayer and the substrate includes a second speed weight along the horizontal direction, the first speed weight is opposite to the second speed weight; wherein the step of controlling the sprayer and the substrate to conduct relative movement further includes: controlling the sprayer and the substrate to conduct the relative movement along the horizontal direction; wherein the step of controlling at least one nozzle of the sprayer to eject the ink when the sprayer moves to a predetermined area of a surface of the substrate further includes: configuring the first speed weight to be equal to the second speed weight such that the ink ejected by the nozzle remains motionless with respect to the substrate along the horizontal direction.

In another aspect, a manufacturing device of OLEDs includes: a sprayer arranged above a substrate, the sprayer includes at least one nozzle configured to ejected ink on a surface of the substrate; a moving unit is configured to control the sprayer to relatively move with respect to the substrate; and wherein during an ejecting process of the ink, an ejecting speed of the ink injected by the nozzle includes a first speed weight along a horizontal direction with respect to the surface of the substrate, and a relative moving speed between the sprayer and the substrate includes a second speed weight along the horizontal direction, the first speed weight is opposite to the second speed weight.

Wherein the first speed weight is configured to be equal to the second speed weight such that the ink ejected by the nozzle remains motionless with respect to the substrate along the horizontal direction.

Wherein the moving unit controls the sprayer to relatively move with respect to the substrate along the horizontal direction;

Wherein the nozzle includes a nozzle body and a bending portion connecting with the nozzle body, the ink passes through the nozzle body and then is outputted from the bending portion, the nozzle body is perpendicular to the surface of the substrate, an included angle between the bending portion and the nozzle body is larger than 0 degree and is smaller than 180 degrees, a bending direction of the bending portion is opposite to a relatively moving direction of the nozzle and the substrate.

Wherein the included angle formed by the bending portion and the nozzle body is 90 degrees.

In another aspect, a manufacturing method of OLEDs includes: controlling a sprayer and a substrate to conduct relative movement; and when the sprayer moves to a predetermined area of a surface of the substrate, at least one nozzle of the sprayer is configured to eject ink, wherein during an ejecting process of the ink, an ejecting speed of the ink injected by the nozzle includes a first speed weight along a horizontal direction with respect to the surface of the substrate, and a relative moving speed between the sprayer and the substrate includes a second speed weight along the horizontal direction, the first speed weight is opposite to the second speed weight.

Wherein the step of controlling the sprayer and the substrate to conduct relative movement further includes: controlling the sprayer and the substrate to conduct the relative movement along the horizontal direction.

Wherein the step of controlling at least one nozzle of the sprayer to eject the ink when the sprayer moves to a predetermined area of a surface of the substrate further includes: configuring the first speed weight to be equal to the second speed weight such that the ink ejected by the nozzle remains motionless with respect to the substrate along the horizontal direction.

Wherein the nozzle includes a nozzle body and a bending portion connecting with the nozzle body, the ink passes through the nozzle body and then is outputted from the bending portion, the nozzle body is perpendicular to the surface of the substrate, an included angle between the bending portion and the nozzle body is larger than 0 degree and is smaller than 180 degrees, a bending direction of the bending portion is opposite to a relatively moving direction of the nozzle and the substrate.

Wherein the included angle formed by the bending portion and the nozzle body is 90 degrees.

In view of the above, the first speed weight of the ejecting speed along the horizontal direction is configured to be opposite to the second speed weight of the relative moving speed along the horizontal direction, and the first speed weight equals to the second speed weight. As such, the ink may fall within a designated area so as to overcome the ink-jet printing error.

DETAILED DESCRIPTION OF THE EMBODIMENTS

Embodiments of the invention will now be described more fully hereinafter with reference to the accompanying drawings, in which embodiments of the invention are shown.

Figure 1:
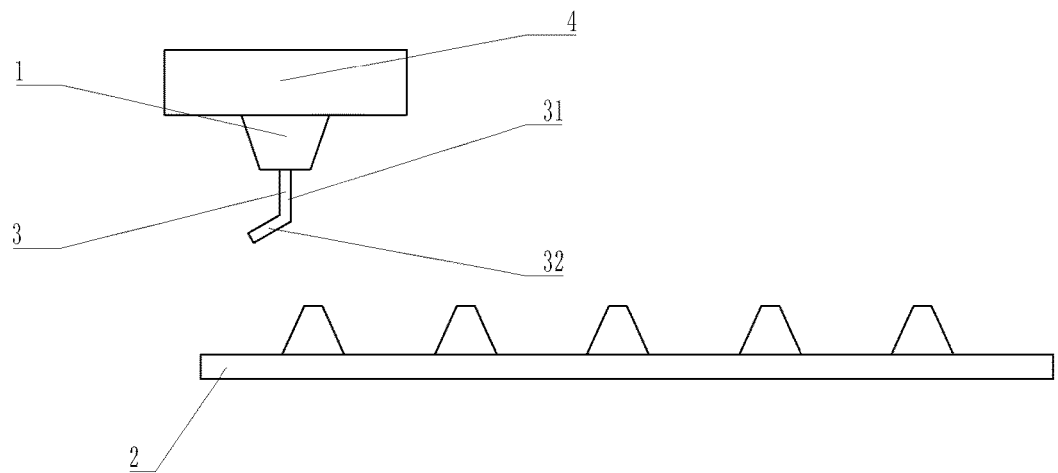
FIG. 1 is a schematic view of the manufacturing device of the OLED in accordance with one embodiment.

FIG. 1 is a schematic view of the manufacturing device of the OLED in accordance with one embodiment. In the embodiment, the manufacturing device includes a sprayer 1 arranged above a substrate 2, and a moving unit 4 controlling relative movement between the sprayer 1 and the substrate 2. The nozzle 1 includes at least one nozzle 3 for spraying ink on a surface of the substrate 2.

In the embodiment, the moving unit 4 controls the sprayer 1 to relatively move along a parallel direction of the surface of the substrate 2. In other embodiments, the moving unit 4 controls the sprayer 1 to relatively move along other angles with respect to the substrate 2. In addition, the term "relatively move" means that the relative location of the sprayer 1 and the substrate 2 has change, which is not limited to whether the sprayer 1 or the substrate 2 has moved.

The nozzle 3 includes a nozzle body 31 and a bending portion 32 connecting with the nozzle body 31. The ink passes through the nozzle body 31 and then is outputted from the bending portion 32. The nozzle body 31 is perpendicular to the surface of the substrate 2. The included angle between the bending portion 32 and the nozzle body 31 is larger than 0 degree and is smaller than 180 degrees. A bending direction of the bending portion 32 is opposite to the relatively moving direction of the nozzle 3 and the substrate 2.

Figure 2:
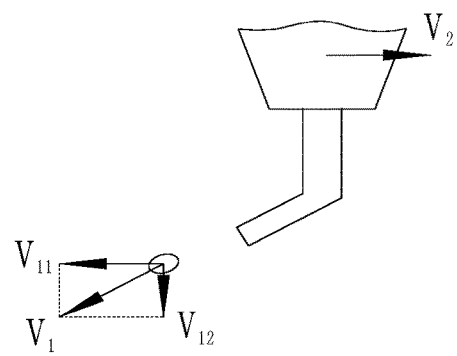
FIG. 2 is a rotation speed analysis diagram showing the moment when the ink is ejected by the nozzle 3 in accordance with the first embodiment.

FIG. 2 is a rotation speed analysis diagram showing the moment when the ink is ejected by the nozzle 3 in accordance with the first embodiment. When the nozzle 3 sprays the ink, the bending portion 32 is configured to be tilt with respect to the substrate 2. The ejecting speed (V1) of the ink may be divided into a speed weight (V11) and (V12), which are respectively along a horizontal direction and a vertical direction with respect to the surface of the substrate 2. At this moment, the sprayer 1 relatively moves along the horizontal direction with respect to the surface of the substrate 2. Thus, the relative moving speed (V2) of the sprayer 1 and the substrate 2 may be the speed weight along the horizontal direction. Further, as the bending direction of the bending portion 32 is opposite to the relative moving direction of the nozzle 3 and the substrate 2, the speed weight (V11) is opposite to the speed weight (V2). Thus, at least a portion of the relative movement between the ink and the substrate 2 caused by the relative movement between the sprayer 1 and the substrate 2 may be offset, and the ink may fall within a designated area so as to overcome the ink-jet printing error.

Similarly, when the sprayer 1 moves along other angles with respect to the substrate 2, the ejecting speed of the nozzle 3 may be configured to be opposite to the speed weight of the relative movement between the sprayer 1 and the substrate 2 along the horizontal direction.

In one embodiment, the speed weight (V11) is the same with the speed weight (V2) such that the ink ejected by the nozzle 3 remains motionless with respect to the substrate 2 along the horizontal direction. As such, the ink may fall within a designated area so as to overcome the ink-jet printing error.

Figure 3:
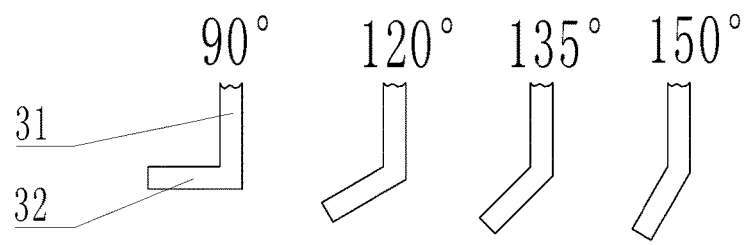
FIG. 3 is a schematic view showing that the included angles, including 90, 120, 135, and 150 degrees, formed by a bending portion 32 and a nozzle body 31 of the manufacturing device of the OLED in accordance with one embodiment.

FIG. 3 is a schematic view showing that the included angles formed by the bending portion 32 and the nozzle body 31 may be 90, 120, 135, or 150 degrees. When the included angle equals to 90 degrees, the ejection speed (V1) does not include the speed weight along the direction perpendicular to the substrate 2. With the increase of the included angle, the ejection speed (V1) of the nozzle 3 is gradually increased such that a first speed weight (V11) of the ejecting speed (V1) along the surface of the substrate 2 is opposite to a second speed weight of the relative moving speed (V2) along the parallel direction. In addition, the speed weight (V11) equals to the second speed weight. When the ejecting speed (V1) of the nozzle 3 is gradually increased, the speed weight (V12) of the ejecting speed (V1) perpendicular to the substrate 2 has also been gradually increased.

In other embodiments, the structure of the nozzle may be configured in accordance with real scenario. The key principle is that the speed weight of the ejection speed along the horizontal direction is opposite to the speed weight of the relative moving speed between the sprayer and the substrate along the horizontal direction.

Figure 4:
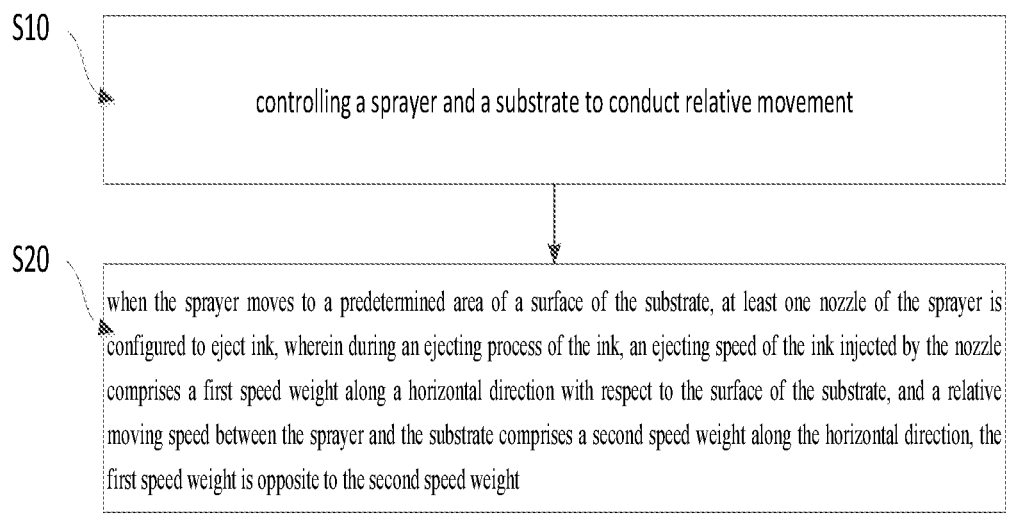
FIG. 4 is a flowchart showing the manufacturing method of the OLED in accordance with the first embodiment.

FIG. 4 is a flowchart showing the manufacturing method of the OLED in accordance with the first embodiment. The method includes the following steps:

In step S10, configuring a sprayer and a substrate to conduct relative movement.

It can be understood that the relative movement may relate to the scenario that the substrate is fixed and the sprayer is moved, or the substrate is moved and the sprayer is fixed.

In step S20, when the sprayer moves to a predetermined area of the surface of the substrate, at least one nozzle of the sprayer is configured to eject the ink. During the ejecting process, the ejecting speed includes a first speed weight along the horizontal direction with respect to the surface of the substrate, and the relative moving speed between the sprayer and the substrate includes a second speed weight along the horizontal direction. The first speed weight is opposite to the second speed weight.

Preferably, in step S10, the sprayer is configured to relatively move with respect to the substrate along the horizontal direction Preferably, in step S20, when the sprayer moves to the predetermined area of the surface of the substrate, the first speed weight is controlled to be equal to the second speed weight such that the ink ejected by the nozzle remains motionless with respect to the substrate along the horizontal direction.

Wherein the sprayer includes a nozzle body and a bending portion connected with the nozzle body. The ink passes through the nozzle body and then is outputted from the bending portion. The nozzle body is perpendicular to the surface of the substrate. The included angle between the bending portion and the nozzle body is larger than 0 degree and is smaller than 180 degrees. A bending direction of the bending portion is opposite to the relatively moving direction of the nozzle and the substrate. The included angle between the bending portion and the nozzle body may be 90, 120, 135, or 150 degrees, which are described in the second embodiment of the manufacturing device of the OLED.

In view of the above, the first speed weight of the ejecting speed along the horizontal direction is configured to be opposite to the second speed weight of the relative moving speed along the horizontal direction, and the first speed weight equals to the second speed weight. As such, the ink may fall within a designated area so as to overcome the ink-jet printing error.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of organic light emitting devices (OLEDs), comprising:
   controlling a sprayer and a substrate to conduct a relative movement therebetween;
   when the sprayer moves to a predetermined area of a surface of the substrate, at least one nozzle of the sprayer is configured to eject ink at an ejecting velocity, wherein during an ejecting process of the ink, the ejecting velocity of the ink injected by the nozzle comprises a first component in a horizontal direction with respect to the surface of the substrate, and a relative moving velocity between the sprayer and the substrate comprises a second component in the horizontal direction, such that the first component of the ejecting velocity is opposite to the second component of the moving velocity;
   wherein the step of controlling the sprayer and the substrate to conduct relative movement further comprises:
   controlling the sprayer and the substrate to conduct the relative movement in the horizontal direction;
   wherein the step of controlling at least one nozzle of the sprayer to eject the ink when the sprayer moves to a predetermined area of a surface of the substrate further comprises:
   configuring the first component of the ejecting velocity to be equal, in magnitude, to the second component of the moving velocity such that the ink ejected by the nozzle remains motionless with respect to the substrate in the horizontal direction; and
   wherein the nozzle comprises a nozzle body that is set in a first direction perpendicular to the surface of the substrate and a bending portion connecting with and extending from the nozzle body in a second direction that is set at a predetermined angle with respect to the first direction such that the ink first moves through the nozzle body in the first direction and then guided by the bending portion to move in the second direction that is different from the first direction of the nozzle body, wherein the predetermined angle that the second direction of the bending portion is set with respect to the first direction of the nozzle body is larger than 0 degree and smaller than 180 degrees and the second direction in which the bending portion extends is opposite to a relatively moving direction between the nozzle and the substrate.

2. A manufacturing method of OLEDs, comprising:
   controlling a sprayer and a substrate to conduct a relative movement therebetween;
   when the sprayer moves to a predetermined area of a surface of the substrate, at least one nozzle of the sprayer is configured to eject ink at an ejecting velocity, wherein during an ejecting process of the ink, the ejecting velocity of the ink injected by the nozzle comprises a first component in a horizontal direction with respect to the surface of the substrate, and a relative moving velocity between the sprayer and the substrate comprises a second component in the horizontal direction, such that the first component of the ejecting velocity is opposite to the second component of the moving velocity;
   wherein the nozzle comprises a nozzle body that is set in a first direction perpendicular to the surface of the substrate and a bending portion connecting with and extending from the nozzle body in a second direction that is set at a predetermined angle with respect to the first direction such that the ink first moves through the nozzle body in the first direction and is then guided by the bending portion to move in the second direction that is different from the first direction of the nozzle body, wherein the predetermined angle that the second direction of the bending portion is set with respect to the first direction of the nozzle body is larger than 0 degree and smaller than 180 degrees and the second direction in which the bending portion extends is opposite to a relatively moving direction between the nozzle and the substrate.

3. The manufacturing method claimed in claim 2, wherein the step of controlling the sprayer and the substrate to conduct relative movement further comprises:
   controlling the sprayer and the substrate to conduct the relative movement in the horizontal direction.

4. The manufacturing method claimed in claim 2, wherein the step of controlling at least one nozzle of the sprayer to eject the ink when the sprayer moves to a predetermined area of a surface of the substrate further comprises:
   configuring the first component of the ejecting velocity to be equal, in magnitude, to the second component of the moving velocity such that the ink ejected by the nozzle remains motionless with respect to the substrate in the horizontal direction.

5. The manufacturing method claimed in claim 2, wherein the predetermined angle that the second direction of the bending portion is set with respect to the first direction of the nozzle body is 90 degrees.

* * * * *